US007233159B2

(12) United States Patent
Allgeyer

(10) Patent No.: US 7,233,159 B2
(45) Date of Patent: Jun. 19, 2007

(54) ERGONOMIC, ROTATABLE ELECTRONIC COMPONENT TESTING APPARATUS

(75) Inventor: Joseph Peter Allgeyer, Gibsonville, NC (US)

(73) Assignee: EMC Corporation, Hopkinton, MA (US)

( * ) Notice: Subject to any disclaimer, the term of this patent is extended or adjusted under 35 U.S.C. 154(b) by 384 days.

(21) Appl. No.: 10/858,991

(22) Filed: Jun. 2, 2004

(65) Prior Publication Data

US 2005/0269308 A1 Dec. 8, 2005

(51) Int. Cl.
*G01R 31/02* (2006.01)

(52) U.S. Cl. .................................... 324/760; 324/158.1

(58) Field of Classification Search ..................... None
See application file for complete search history.

(56) References Cited

U.S. PATENT DOCUMENTS

| | | | | |
|---|---|---|---|---|
| 4,468,616 | A | 8/1984 | Yoshizaki | |
| 4,636,723 | A | 1/1987 | Coffin | |
| 4,683,424 | A | 7/1987 | Cutright et al. | |
| 4,757,255 | A | 7/1988 | Margozzi | |
| 4,812,750 | A * | 3/1989 | Keel et al. | 324/760 |
| 4,962,355 | A | 10/1990 | Holderfield et al. | |
| 5,087,878 | A | 2/1992 | Belmore, III et al. | |
| 5,103,168 | A * | 4/1992 | Fuoco | 324/760 |
| 5,486,681 | A * | 1/1996 | Dagnac et al. | 219/400 |
| 5,543,727 | A | 8/1996 | Bushard et al. | |
| 5,798,653 | A * | 8/1998 | Leung, Jr. | 324/760 |
| 5,859,409 | A * | 1/1999 | Kim et al. | 219/400 |
| 6,113,262 | A * | 9/2000 | Purola et al. | 374/45 |
| 6,119,255 | A * | 9/2000 | Akram | 714/724 |
| 6,157,201 | A * | 12/2000 | Leung, Jr. | 324/760 |
| 6,388,437 | B1 | 5/2002 | Wolski et al. | |
| 6,496,025 | B1 | 12/2002 | Stadelmayer et al. | |
| 6,910,162 | B2 * | 6/2005 | Co et al. | 714/718 |

FOREIGN PATENT DOCUMENTS

JP 2000097887 A * 4/2000 .................. 23/223

OTHER PUBLICATIONS

"Heat Systems Self-Regulating Application and Design Guide H53585: Freeze Protection at Its Best," Raychem, p. 1-32 (1997).

* cited by examiner

*Primary Examiner*—Ha Tran Nguyen
*Assistant Examiner*—Richard Isla-Rodas
(74) *Attorney, Agent, or Firm*—Jenkins, Wilson, Taylor & Hunt, P.A.

(57) ABSTRACT

Apparatuses and methods for testing electronic components, such as printed circuit boards, in an ergonomic manner are disclosed. An electronic component testing apparatus comprises a base, a test chamber rotatably mounted to the base, and a heating and cooling unit coupled to the test chamber. The test chamber further includes a chassis defining an enclosure having an opening and at least one test slot accessible through the opening for facilitating operative coupling of an electronic component to the test chamber for testing of the electronic component.

25 Claims, 5 Drawing Sheets

ERGONOMIC, ROTATABLE ELECTRONIC COMPONENT TESTING APPARATUS

TECHNICAL FIELD

The subject matter disclosed herein relates generally to apparatuses and methods for testing electronic components, and more particularly to providing an ergonomic, rotatable testing apparatus for testing of electronic components such as printed circuit boards.

BACKGROUND ART

For electronic components such as printed circuit boards, environmental stress screening, also commonly referred to as "ageing" or "burn-in" is a part of the usual factory quality control process. Despite the use of high-quality components and assembly procedures, the highly complex nature of electronic components subjects them to occasional manufacturing defects and failures during use. Environmental testing, such as testing variations in temperature, voltage, humidity, etc., is often employed as a means to expedite failure occurrence during production testing of electronic components prior to delivery to end-users or as a way to isolate a given failure that has occurred during the manufacturing process or after use in the field. Because of the high costs associated with such defects and failures in terms of manufacturer warranty obligations and end-user down time, typically a manufacturer will use environmental testing as a way to limit the amount of defective circuit boards leaving the factory as new or being returned to the factory as defective. Therefore, this testing is deemed highly important to manufacturers as part of their customer service and support programs.

While many of the environmental testing steps are completely automated, fault isolation procedures require the intervention of a human operator to transfer the electronic component to the testing chamber, to connect the various data and power cables, to set the environmental parameters in order to reproduce the failure conditions, to probe the electronic component to isolate the failure, and to remove the electronic component from the testing chamber following the fault isolation process. These operator-assisted testing procedures usually include many tedious hours of probing fine pitch electronic components which results in considerable eye and neck strain and can increase the incidence of repetitive motion injuries. Intense competition among manufactures strongly motivates the development and implementation of testing procedures that minimize unit-manufacturing costs. Therefore, ergonomic testing devices that can minimize operator injuries and correspondingly reduce overall manufacturing costs are highly desired.

Moreover, in the usual practice, electronic component testing devices have included several cables that must be connected to and disconnected from the component being tested during each test. After tens or hundreds of connect/disconnect cycles, these cables can develop unpredictable failures, such as open circuits, sporadic intermissions and short circuits. These failures may be related to the cyclic mechanical bending of the cables as welt as the tensile stress induced by pulling on the cable to disconnect the electronic component following testing. These types of failures can be very costly to the manufacturer because failed test cables give erroneous quality control test results leading to a high rate of false rejection and unnecessary rework. It is estimated that the situation due to failing cables can cost manufactures millions of dollars per year in unneeded rework expenses. Accordingly, it is desirable to reduce external cabling required to test electronic components.

Additionally, previous methods of environmental fault isolation testing have been very inefficient to the manufacturer. Previous fault isolation chambers have used externally located heating/cooling units connected to the chamber via external duct work, leading to loss of thermal energy and reduced access to the testing chamber. Also, previous testing chambers have used constant wattage frame heaters for external condensation control. Constant wattage frame heaters have numerous disadvantages, such as wasted power, constant heating of the frame leading to possible hazardous burn conditions, and operator attentiveness required for manually switching on and off the heater strips.

In prior environment test chambers without frame heaters, substantial condensation on chamber surfaces may occur when the chambers are operated for extended periods below the ambient dew point. Such condensation can lead to hazardous electrical conditions.

Therefore, it would be advantageous to employ an ergonomic electronic component testing apparatus that limits the amount of operator motion required for full testing of an electronic component, such as a printed circuit board. Additionally, it would be advantageous to provide an electronic component testing apparatus wherein external heating and cooling ducts and electrical wiring are integrated into the testing unit in order to provide a rotatable unit free from external encumbrances.

DISCLOSURE OF THE INVENTION

The present invention provides an electronic component testing apparatus comprising a base, a test chamber rotatably mounted to the base, and a heating and cooling unit coupled to the test chamber. The test chamber includes a chassis or frame defining an enclosure having at least one opening and at least one test slot accessible through the opening for facilitating operative coupling of an electronic component to the test chamber for testing of the electronic component.

In one implementation, the base includes an upper horizontal frame and a lower horizontal frame, the upper and lower horizontal frames being connected by at least one vertical strut. Wheels may be attached to the lower horizontal frame so that the base is mobile over a surface. The chassis of the test chamber may be a parallelepiped structure including a top wall, a bottom wall, and two pairs of opposing sidewalls. The sidewalls may each define an opening. One or more doors may be removably attached to each sidewall for closing the test chamber during testing. Door retainers may be provided on the vertical struts for holding the doors when they are removed from the sidewalls.

The test chamber may also include a directable dry air purge apparatus, an interior light source, an integrated power strip, and a self-regulating chassis heater for condensation control.

A method of testing electronic components in an ergonomic manner is also disclosed. The method may include providing an electronic component testing apparatus including a base, a test chamber rotatably mounted to the base, and a heating and cooling unit coupled to the test chamber, wherein the test chamber further includes a chassis defining an enclosure having an opening and at least one test slot accessible through the opening for facilitating operative coupling of an electronic component to the test chamber for testing of the electronic component. The method may further include providing an electronic component to be tested, wherein the electronic component has a first side and a second side (also known in the industry as the "solder side" and "component side"). The electronic component is inserted into the test slot in the test chamber where electronic testing is performed while the electronic component is subjected to varying environmental conditions. A technician may rotate the test chamber to electronically or mechanically probe the electronic component before, during, and/or after the testing.

It is therefore an object to provide an ergonomic electronic component testing apparatus and method for limiting the amount of operator motion required for full testing of an electronic component, such as a printed circuit board.

It is another object to provide an ergonomic electronic component testing apparatus and method wherein external heating and cooling ducts and electrical wiring are integrated into the testing unit in order to provide a rotatable unit free from external encumbrances.

Some of the objects of the invention having been stated hereinabove, and which are addressed in whole or in part by the present invention, other objects will become evident as the description proceeds when taken in connection with the accompanying drawings as best described hereinbelow.

DETAILED DESCRIPTION OF THE INVENTION

Figure 1:
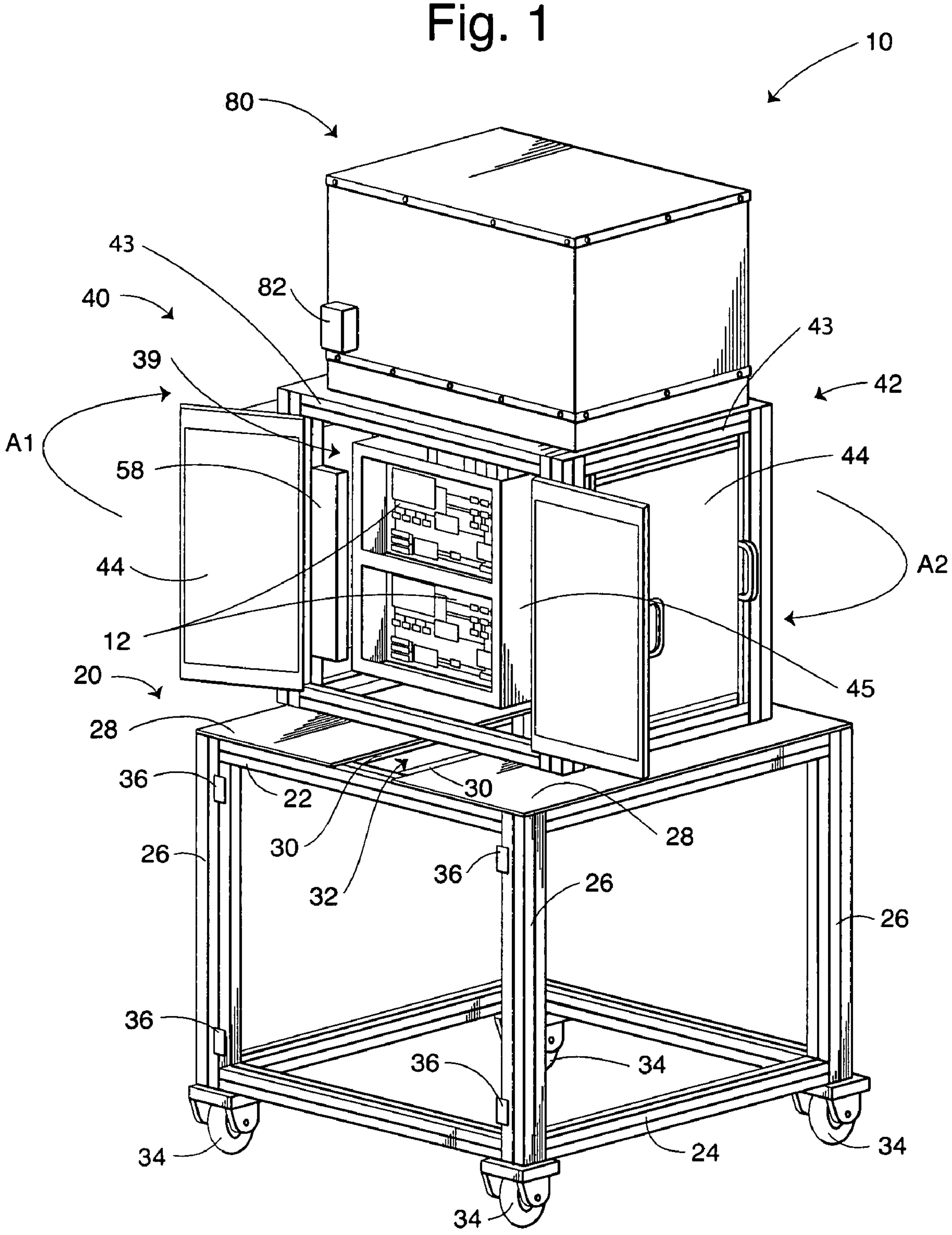
FIG. 1 is a perspective view of the electronic component testing apparatus according to an embodiment of the present invention.

As stated above, the present invention is related to apparatuses and methods for testing of electronic components, such as printed circuit boards. Referring now to FIGS. 1-4, one embodiment of an electronic component testing apparatus of the present invention, generally designated 10, includes a base, generally designated 20, a test chamber, generally designated 40, and a heating and cooling unit, generally designated 80. The electronic component to be tested is shown by way of example as printed circuit board 12.

In the illustrated example, base 20 includes an upper horizontal frame 22 and a lower horizontal frame 24, joined together by vertical struts 26 to form a rigid generally parallelopiped structure. Upper horizontal frame 22, lower horizontal frame 24, and vertical struts 26 may be constructed of plastic, metal, such as extruded aluminum, or any other framing material known to those of skill in the art. Plates 28 may be located on upper horizontal frame 22 for defining a work surface for a technician and a place for the technician to place tools. A pair of cross members 30 provides support for plates 28 and for chamber 40. Cross members 30 are spaced from each other to define a channel 32. Channel 32 facilitates rotational coupling between chamber 40 and base 20, as will be described in detail below.

Base 20 may further include wheels 34 or other form of mobile attachments, which are connected to lower horizontal frame 24 so that base 20 is mobile over a surface. Vertical struts 26 of base 10 may further include one or more door retainers 36 for storing removable doors associated with the test chamber 40.

Test chamber 40 may be rotatably coupled to base 20 so that test chamber 40 may be rotated in a plane parallel to the plane of plates 28 as indicated by arrows A1 and A2. Test chamber 40 may rotate through any suitable angle to facilitate access to the interior of chamber 40 from different sides. In one implementation, test chamber may rotate through an angle of 360°. This rotation allows the technician to test printed circuit board 12 in an extremely ergonomic manner. An exemplary rotational coupling for providing rotation of test chamber 40 will be described in detail below.

Test chamber 40 may include a chassis 42 forming a thermal enclosure of a box-like structure having pairs of opposing sidewalls 43 including a plurality of openings, such as opening 39, though which printed circuit board 12 can be accessed for testing. In order to provide a thermally maintainable enclosure with access for the technician, the openings 39 defined by chassis 42 may be covered by doors 44. Doors 44 are typically double glazed for maximum thermal protection and may be removable from chassis 42 during periods of non-thermal testing of circuit board 12 and stored on door retainers 36 on base 20 (see FIG. 2).

Test chamber 40 further includes a card cage or support 45 for positioning and supporting circuit board 12 within the enclosure. Card support 45 may be any suitable frame structure fixedly attached to chassis 42 and adapted to slidably receive an edge of circuit board 12 and support the same during testing.

Figure 2:
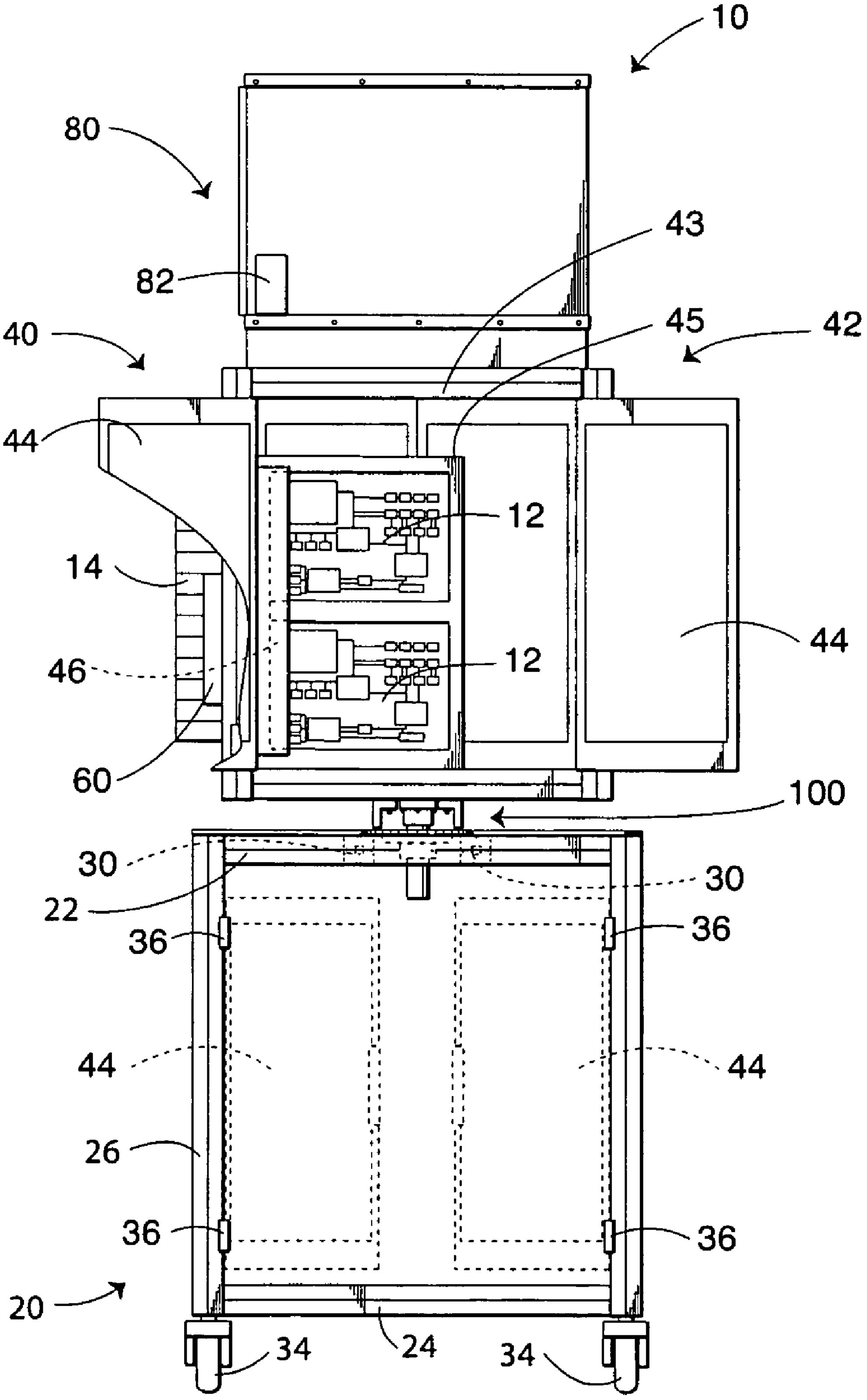
FIG. 2 is a front elevation view of the apparatus illustrated in FIG. 1.
Figure 3:
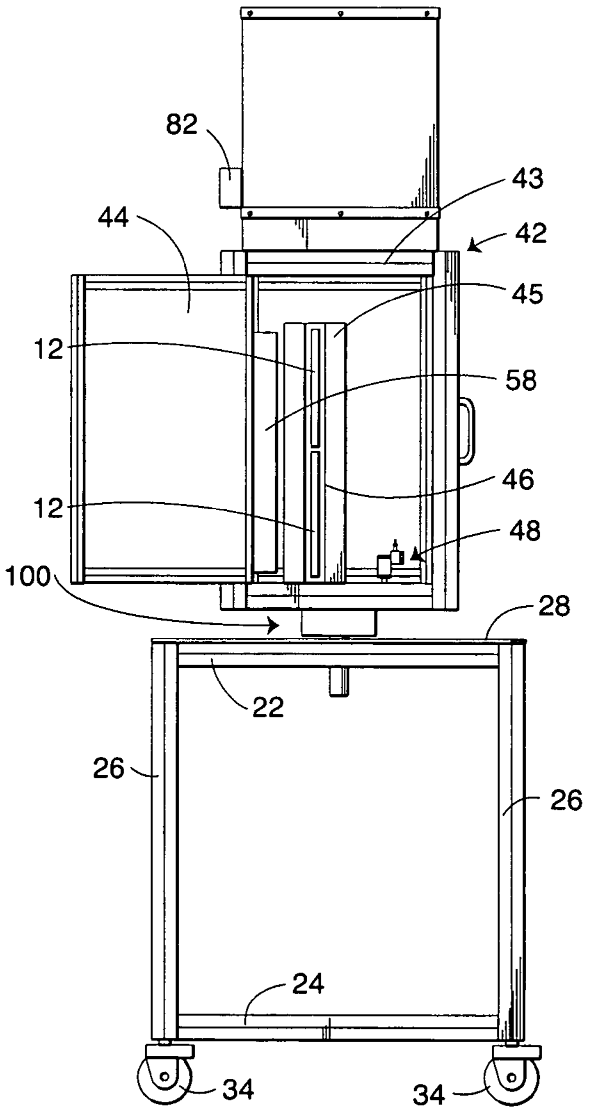
FIG. 3 is a right side elevation view of the apparatus illustrated in FIG. 1.
Figure 4:
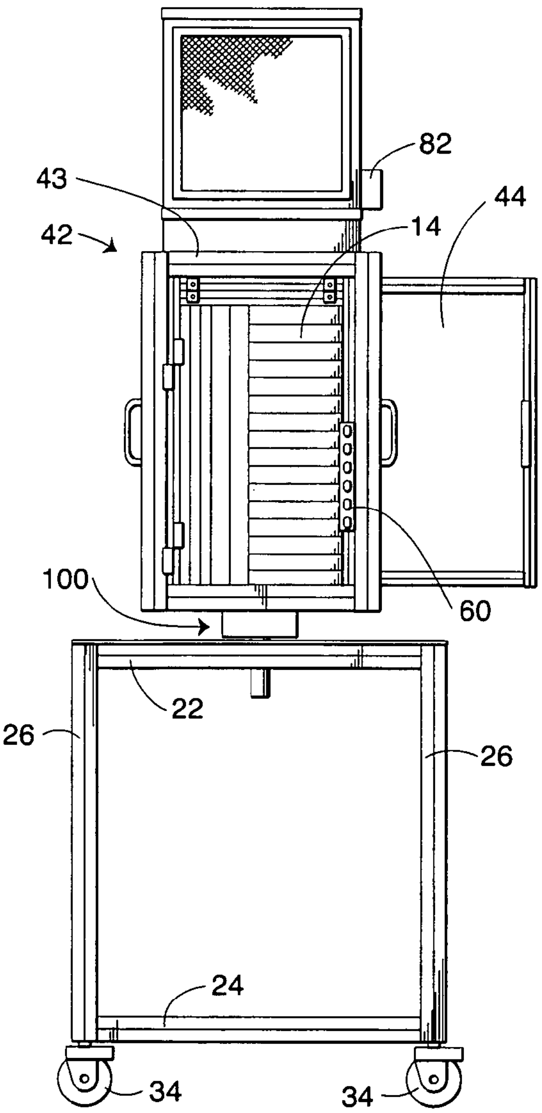
FIG. 4 is a left side elevation view of the apparatus illustrated in FIG. 1.

Referring to FIGS. 2 and 3, at least one test slot 46 is mounted inside chassis 42 for facilitating operative coupling of circuit board 12 to test chamber 40 for testing of circuit board 12. Test slot 46 is adapted to receive electrical connectors on circuit board 12 for sending data from disk drives 14 to circuit board 12 and back again to detect errors generated by circuit board 12. Thus, when electrical connectors on circuit board 12 are plugged into test slot 46, test chamber 40 is operably connected to circuit board 12 for testing purposes.

Figure 6:
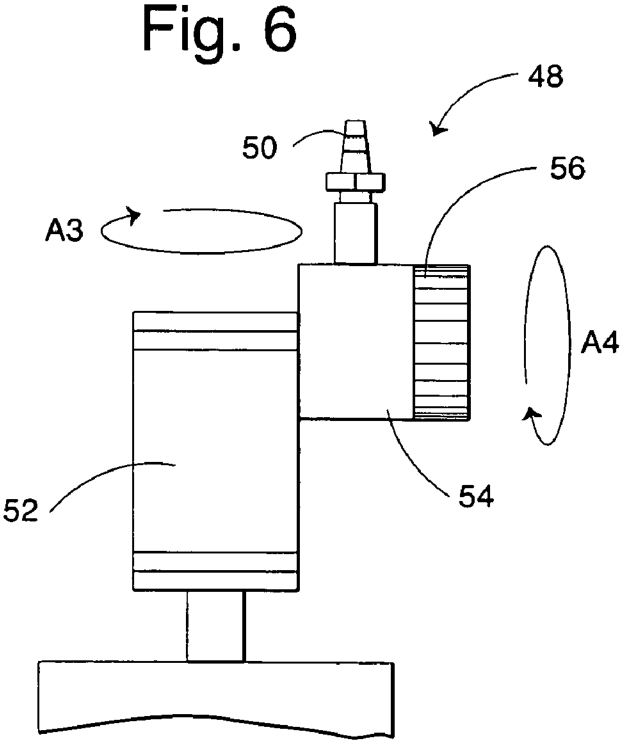
FIG. 6 is a detailed view of the dry air purge of the apparatus illustrated in FIG. 1.

Referring to FIGS. 3 and 6, a directable dry air purge, generally designated 48, can also be provided within test chamber 40 for minimization of condensation within the apparatus and to provide heating or cooling of printed circuit board 12 during testing. In FIG. 6, directable dry air purge 48 includes an air outlet 50 mounted on a base including a rotating member 52 and a pivoting member 54. Rotating member 52 rotates directable dry air purge 48 in a direction that is parallel to the plane of a floor of chamber 40, as indicated by arrow A3. Pivoting member 54 pivots in a direction perpendicular to the floor of chamber 40 as indicated by arrow A4. A regulator 56 controls air flow through outlet 50. Directable air purge 48 is preferably connected to a dry air source (not shown in FIG. 3 or FIG. 6). Thus, using the structure illustrated in FIG. 6, directable air purge 48 provides a mechanism for directing a stream of dry air to any desired portion of a component under test. Providing a directable stream of air allows a technician to spot heat or spot cool the component being tested and also allows the technician to remove particulate matter, such as dust or loose solder from a component under test with minimal physical exertion.

In order to minimize cables running to test chamber 40, an integrated light source 58 (see FIGS. 1 and 3) may be provided in the interior of test chamber 40 for lighting the work space for the technician. Likewise, in order to minimize power cables running to and from test chamber 40, an integrated power strip 60 (see FIGS. 2 and 4), such as a universal International Electrotechnical Commission (IEC) power strip, may be mounted on the exterior of chassis 42 so that all electrical devices used within test chamber 40 can be plugged into power strip 60 and rotated along with test chamber 40. Power strip 60 provides a globally compatible, AC power connection to testing apparatus 10 with the requirement of only one power cable being fed to the apparatus.

Figure 7:
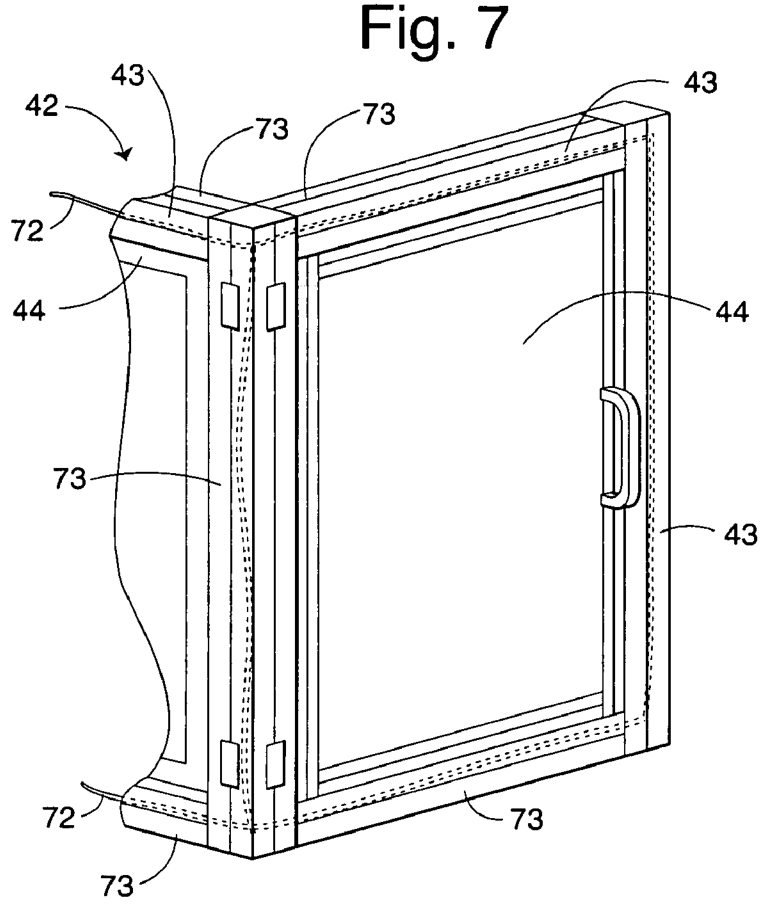
FIG. 7 is a detailed view of the chassis heater of the apparatus illustrated in FIG. 1.

As discussed hereinabove, when typical thermal testing apparatuses are cooled to temperatures below the ambient dew point (approximately 15° C.) the frames of the thermal testing chambers can experience substantial condensation leading to electrical and other hazards. Referring to FIG. 7, chassis 42 of test chamber 40 of the present invention may further include a self-regulating chassis heater 72 for heating of the chassis. In one example, chassis heater 72 may comprise self-regulating heat tape commercially available from Raychem Corporation of Menlo Park, Calif. Self-regulating heat tape suitable for use with embodiments of the present invention may include sixteen-gauge tin to copper bus wirers encased in a self-regulating, conductive core. The cable may be covered with a bonded inner jacket and a thermoplastic elastomer outer jacket. An additional tin to copper overbraid may be provided for a low resistance path to ground. The bus wires of the cable may be connected to a power source, such as an AC power source. Exemplary commercially available heat tape suitable for use with embodiments of the present invention is described in heat systems application and design guide H53585, Raychem Corporation, 1999, the disclosure of which is incorporated herein by reference in its entirety.

Self-regulating heat tape is typically used on metal and plastic pipes for freeze protection and low temperature process maintenance. According to the present embodiment, the heat tape of chassis heater 72 may be embedded internally or on the surface of chassis 42. For example, cross members 73 that form chassis 42 may include an internal passageway through which chassis heater 72 may extend in some parts of chassis 42. In other parts of chassis 42, such as parts where two cross members 73 meet and their interior passageways do not intersect, chassis heater 72 may extend outside of cross members 73.

In operation, chassis heater 72 is designed to maintain chassis 42 at a temperature above the ambient dew point without the need for a thermostat. For example, if chassis 42 cools, the temperature output of chassis heater 72 will increase automatically. As the temperature of chassis heater 72 rises to heat chassis 42, the heat output of chassis heater 72 automatically decreases. This feature of the present invention prevents condensation from forming on the external surfaces of test chamber 40 and reduces the hazards associated therewith.

Referring back to FIG. 1, heating and cooling unit 80 is integrally coupled to test chamber 40. The integration of heating and cooling unit 80 into test chamber 40 eliminates all external ducting to a heating and cooling unit that in the past has encumbered access to the testing apparatus by the technician. In one embodiment, heating and cooling unit 80 is mounted to the top surface of test chamber 40 so that heated or cooled air is blown into test chamber 40 in order to create the thermal condition set by the technician. In an alternate embodiment, heating and cooling unit 80 may be mounted to any of the side surfaces or to the bottom surface of test chamber 40 without departing from the scope of the invention. The temperature that heating and cooling unit 80 maintains inside test chamber 40 is programmed in and maintained by thermostat 82 which is mounted to heating and cooling unit 80. Heating and cooling unit 80 can be any standard commercial unit, such as Model No. HB160926032ER made by APW, Ltd. of Waukesha, Wis., and thermostat 82 can be any typical commercial thermostat, such as Model Number A419 commercially available from Johnson Controls Corporation of Milwaukee, Wis.

Figure 8:
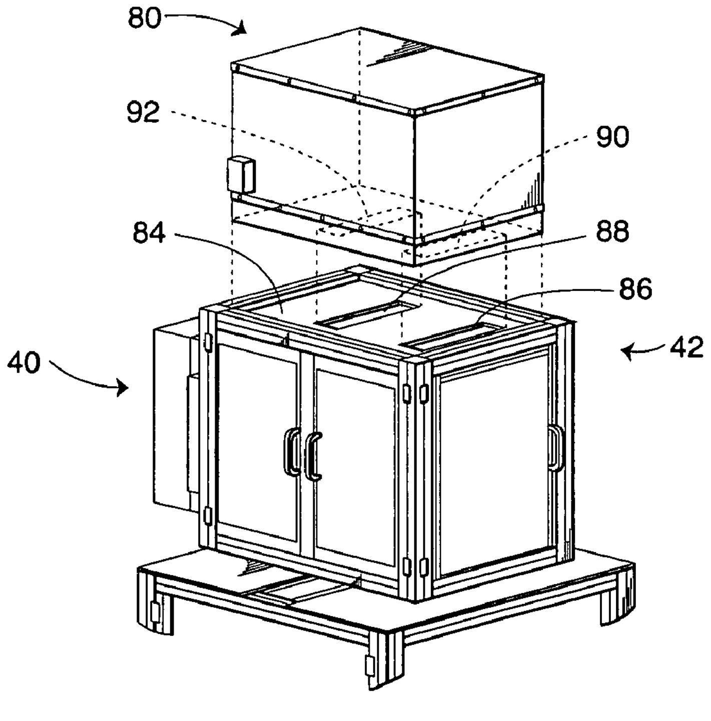
FIG. 8 is an exploded view further detailing the interconnection between the test chamber and the heating and cooling unit of the apparatus illustrated in FIG. 1.

FIG. 8 is an exploded view of heating and cooling unit 80 and chassis 42. In FIG. 8, chassis 42 includes an upper surface 84 that includes an air intake aperture 86 and an air outflow aperture 88 that match with corresponding apertures 90 and 92, respectively, on the lower surface of heating and cooling apparatus 80. Because heating and cooling unit 80 is mounted to chassis 42 without external duct work, 360° rotation of chassis 42 can be easily achieved without disengaging heating and cooling apparatus 80.

Figure 5:
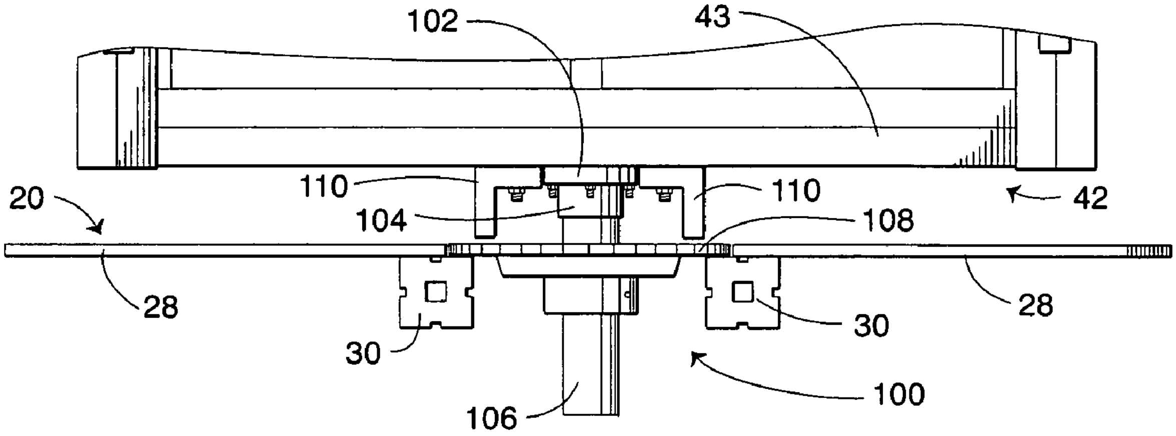
FIG. 5 is a vertical cross-section view of the rotating coupler of the apparatus illustrated in FIG. 1.

As stated above, chassis 42 is preferably rotatably mounted to base 20. In one example, as shown in FIG. 2 and as shown in more detail in FIG. 5, chassis 42 may be rotatably mounted to base 20 using a rotational coupling, such as an axle and hub assembly 100, of the same type used to mount wheels to rolling vehicles. In FIG. 5, chassis 42 is fixedly attached to a flange 102 of a hub assembly 104. Hub assembly 104 includes roller bearings that allow hub and consequently chassis 42 to rotate about an axle 106. Axle 106 is fixably attached to cross members 30 of base 20 via sprocket 108. Because axle 106 is fixably attached to base 20 and chassis 42 is rotatably attached to axle 106, chassis 42 is capable of rotating with respect to base 20. Angle brackets 110 may be mounted on opposing sides of flange 102 to stabilize chassis 42. Although in the example illustrated in FIG. 5, hub assembly 104 is fixedly attached to chassis 42 and axle 106 is fixedly attached to base 20, the present invention is not limited to such an embodiment. In an alternate embodiment, hub assembly 104 may be fixedly attached to base 20 and axle 106 may be fixedly attached to chassis 42.

In design and operation, the integrated heating and cooling unit and electrical aspects of the testing apparatus, along with the rotation ability of the test chamber allows optimal access to both sides of the printed circuit board or other electronic component by the testing technician without the technician having to move from their posted position. In operation, the technician will first approach testing apparatus 10 and establish a position that the technician will maintain throughout the testing procedure. If the thermal testing of circuit board 12 is not required, the technician may remove doors 44 and place them upon door supports 36 (FIG. 2) so that testing chamber 40 is less encumbered by doors 44. Otherwise, doors 44 will remain in place for thermal environment stabilization.

Test chamber 40 is then rotated to a position so that the technician can insert circuit board 12 into test slot 46 so that the circuit board 12 is operatively coupled to test chamber 40 for testing. It is envisioned that test chamber 40 may include a plurality of test slots 46 and therefore several circuit boards 12 may be tested simultaneously depending on the parameter to be tested and the speed at which the technician must perform the testing procedure.

If thermal testing is required, the technician will then shut all doors 44 and will set thermostat 82 on the desired temperature at which circuit board 12 should be tested, so that heating and cooling unit 80 begins to heat or cool test chamber 40 to the desired temperature.

Once circuit board 12 has been properly seated in test slot 46 and the proper test temperature has been reached inside test chamber 40 (if applicable), the requisite testing data sequence will then be established by the technician so that data begins to flow from drives 14 to circuit board 12. When a fault is indicated, the technician will open doors 44 (if applicable) and by using probes or other electronic testing tools can test one side of circuit board 12 for the applicable data information or fault location. Once testing on this side of circuit board 12 is complete, the technician can easily rotate test chamber 40 so that additional probing can be performed on the other side of circuit board 12.

During testing, if circuit board 12 requires spot heating or cooling, the technician can direct dry air purge 48 to a specific position so as to isolate an air stream directly to the component needing the additional air flow. Additionally, as discussed hereinabove, if the temperature within test chamber 40 should cool down below the ambient dew point during testing, self regulating chassis heater 72 will automatically turn on, thus warming chassis 42 and reducing the potential for condensation to form on the unit.

Once testing is complete on circuit board 12, the technician will then rotate test chamber 40 to a position so that circuit board 12 can be removed from test slot 46 thereby rendering the test cycle complete. At this point, another test cycle can be commenced or testing apparatus 10 may be moved from its current position to a storage area for storage.

It will be understood that various details of the invention may be changed without departing from the scope of the invention. Furthermore, the foregoing description is for the purpose of illustration only, and not for the purpose of limitation, as the invention is defined by the claims as set forth hereinafter.

What is claimed is:

1. An electronic component testing apparatus comprising:

(a) a base;

(b) a test chamber including:

(i) a chassis defining an enclosure having pairs of opposing sidewalls, wherein each of the opposing sidewalls includes an opening; and (ii) at least one test slot accessible through the openings for facilitating operative coupling of an electronic component to the test chamber for testing of the electronic component;

(c) a rotational coupling for coupling the base to the test chamber so that the test chamber is rotatable with respect to the base and so that interior of the test chamber can be accessed from different sides through the openings; and (d) a heating and cooling unit coupled to the test chamber for controlling temperature within the enclosure.

2. The electronic component testing apparatus of claim 1 wherein the base includes an upper horizontal frame and a lower horizontal frame, the upper and lower horizontal frames being connected by at least one vertical strut.

3. The electronic component testing apparatus of claim 2 wherein the base includes wheels attached to the lower horizontal frame so that the base is mobile over a surface.

4. The electronic component testing apparatus of claim 1 wherein the test chamber includes a door that covers the opening of the enclosure.

5. The electronic component testing apparatus of claim 4 wherein the door comprises at least one pane of glass.

6. The electronic component testing apparatus of claim 4 wherein the door is removably connected to the test chamber.

7. The electronic component testing apparatus of claim 1 wherein the test chamber further includes a light source located in the enclosure.

8. The electronic component testing apparatus of claim 1 wherein the test chamber further includes a power strip for providing a plurality of power connections to the chamber via a single power cable.

9. The electronic component testing apparatus of claim 1 wherein the chassis of the test chamber further includes a chassis heater.

10. The electronic component testing apparatus of claim 9 wherein at least a portion of the chassis heater is imbedded in the chassis.

11. The electronic component testing apparatus of claim 9 wherein at least a portion of the chassis heater is mounted on a surface of the chassis.

12. The electronic component testing apparatus of claim 1 wherein the chassis of the test chamber comprises a metal material.

13. The electronic component testing apparatus of claim 12 wherein the metal comprises extruded aluminum.

14. The electronic component testing apparatus of claim 1 wherein the heating and cooling unit is coupled to the test chamber without the use of intermediate ductwork.

15. The electronic component testing apparatus of claim 1 comprising a thermostat coupled to the heating and cooling unit for controlling output of the heating and cooling unit.

16. The electronic component testing apparatus of claim 1 wherein the electronic component comprises a printed circuit board.

17. An electronic component testing apparatus comprising:

(a) a base;

(b) a test chamber including:

(i) a chassis defining an enclosure having at least one opening;

(ii) at least one test slot accessible through the opening for facilitating operative coupling of an electronic component to the test chamber for testing of the electronic component; and (iii) a door that covers the opening of the enclosure with the door being removably connected to the test chamber;

(c) a rotational coupling for coupling the base to the test chamber so that the test chamber is rotatable with respect to the base;

(d) a heating and cooling unit coupled to the test chamber for controlling temperature within the enclosure; and (e) at least one door retainer attached to the base and adapted to receive the door when the door is removed from the test chamber.

18. An electronic component testing apparatus comprising:

(a) a base;

(b) a test chamber including:

(i) a chassis defining an enclosure having at least one opening; and (ii) at least one test slot accessible through the opening for facilitating operative coupling of an electronic component to the test chamber for testing of the electronic component;

(c) a rotational coupling for coupling the base to the test chamber so that the test chamber is rotatable with respect to the base;

(d) a heating and cooling unit coupled to the test chamber for controlling temperature within the enclosure; and wherein the test chamber further includes a directable dry air purge apparatus.

19. The electronic component testing apparatus of claim 18 wherein the directable dry air purge apparatus is rotatable about a first axis and pivotable about a second axis transverse to the first axis.

20. The electronic component testing apparatus of claim 18 wherein the directable dry air purge apparatus includes a regulator for regulating airflow through the dry air purge apparatus.

21. An electronic component testing apparatus comprising:

(a) a base;

(b) a test chamber including:

(i) a chassis defining an enclosure having at least one opening; and (ii) at least one test slot accessible through the opening for facilitating operative coupling of an electronic component to the test chamber for testing of the electronic component;

(c) a rotational coupling for coupling the base to the test chamber so that the test chamber is rotatable with respect to the base;

(d) a heating and cooling unit coupled to the test chamber for controlling temperature within the enclosure; and a chassis heater, wherein the chassis heater comprises self-regulating heat tape.

22. An electronic component testing apparatus comprising:

(a) a base;

(b) a test chamber including:

(i) a chassis defining an enclosure having at least one opening; and (ii) at least one test slot accessible through the opening for facilitating operative coupling of an electronic component to the test chamber for testing of the electronic component;

(c) a rotational coupling for coupling the base to the test chamber so that the test chamber is rotatable with respect to the base;

(d) a heating and cooling unit coupled to the test chamber for controlling temperature within the enclosure; and wherein the rotational coupling includes a hub and an axle, wherein the test chamber is fixedly attached to the hub, the base is fixedly attached to the axle, and the axle is rotationally coupled to the hub.

23. The electronic component testing apparatus of claim 22 wherein the hub includes roller bearings for facilitating rotational movement of the hub and attached test chamber around the axle and attached base.

24. An electronic component testing apparatus comprising:

(a) a base;

(b) a test chamber including:

(i) a chassis defining an enclosure having at least one opening; and (ii) at least one test slot accessible through the opening for facilitating operative coupling of an electronic component to the test chamber for testing of the electronic component;

(c) a rotational coupling for coupling the base to the test chamber so that the test chamber is rotatable with respect to the base;

(d) a heating and cooling unit coupled to the test chamber for controlling temperature within the enclosure; and wherein the rotational coupling includes a hub and an axle, wherein the test chamber is fixedly attached to the axle, the base is fixedly attached to the hub, and the axle is rotationally coupled to the hub.

25. The electronic component testing apparatus of claim 24 wherein the hub includes roller bearings for facilitating rotational movement of the hub and attached base around the axle and attached test chamber.

* * * * *